May 2, 1967 W. Y. WONG 3,317,749

TUNNEL DIODE FLIP-FLOP CIRCUIT HAVING MUTUALLY COUPLED INPUT CIRCUITS

Filed April 30, 1964

Inventor.
William Y. Wong

By: Louis A. Kline
John J. Mattago
Richard T. Lengel

His Attorneys.

United States Patent Office 3,317,749

Patented May 2, 1967

3,317,749

TUNNEL DIODE FLIP-FLOP CIRCUIT HAVING MUTUALLY COUPLED INPUT CIRCUITS

William Y. Wong, Los Angeles, Calif., assignor to The National Cash Register Company, Dayton, Ohio, a corporation of Maryland Filed Apr. 30, 1964, Ser. No. 363,743
6 Claims. (Cl. 307—88.5)

The present invention is directed to flip-flop circuits and, more particularly, to improved high-speed flip-flops employing negative resistance diodes.

In the improved flip-flop circuits of the present invention, "Esaki" diodes, more commonly known as tunnel diodes, are the preferred type of negative resistance diodes which are being employed to provide improved, high speed operation. These tunnel diodes comprise p-n junction semiconductors which exhibit a negative resistance over a portion of their voltage-current operating characteristic. This operation of the tunnel diodes depends on "quantum-mechanical tunneling" of majority carriers across a very thin semiconductor junction. A tunnel diode circuit including a suitable series resistor and voltage source provides stable high and low current stable states and corresponding output signals representing binary digits "0" and "1," respectively.

An object of the present invention is to provide an improved high-speed, tunnel diode flip-flop circuit.

Another object of the present invention is to provide a tunnel diode flip-flop capable of being triggered from one stable state to the other stable state by a minimum, small amplitude trigger signal.

Still another object of the present invention is to provide a flip-flop circuit requiring only two diodes.

A further object of the present invention is to provide a flip-flop circuit capable of operating at high speed for use with high speed tunnel diode memories and other logical circuits.

Still another object of the present invention is to provide a tunnel diode flip-flop having separate true and false inputs and outputs.

Another object of the present invention is to provide a flip-flop circuit having a pair of bistable circuits including negative resistance diodes having high and low current states and a pair of input trigger circuits for inductively coupling trigger signals to each of the bistable circuits for producing concurrent switching of diode elements of the flip-flop into opposite high and low current stable states.

Still another object of the present invention is to provide mutual inductive coupling between trigger input circuits of a flip-flop circuit including a pair of bistable tunnel diode circuits to develop switching signals of opposite phase for placing said pair of bistable circuits in opposite high and low current stable states in accordance with the switching signals applied to said bistable circuits.

A further object of the invention is to provide a flip-flop circuit employing a pair of negative resistance diodes wherein there is no limitation to any particular type of negative resistance diode or other similar limitations or specific requirements which restrict the use of the flip-flop circuit in logical systems.

Other objects and features of the present invention will become apparent to those skilled in the art as the disclosure is made in the following detailed description of a preferred embodiment of the invention as illustrated in the accompanying sheet of drawings in which.

Figure 1:
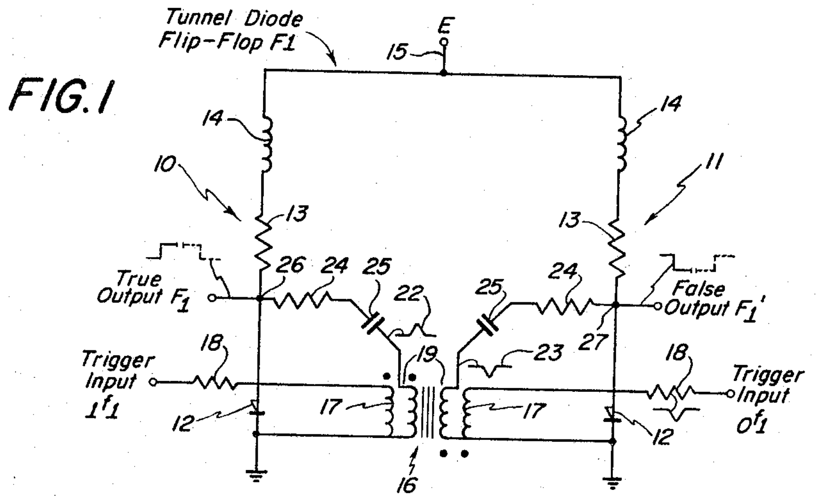
FIG. 1 is a circuit diagram showing a preferred embodiment of the flip-flop circuit of the present invention.

Referring now to FIG. 1 of the drawings, the flip-flop circuit F1 of the present invention is shown to comprise a pair of identical bistable tunnel diode circuits 10 and 11, each including a tunnel diode 12, a resistor 13, and an inductor 14 connected in series to a current source 15. Inputs $_1f_1$ and $_0f_1$ are provided for receiving trigger signals for setting and resetting flip-flop F1. Each of these inputs $_1f_1$ and $_0f_1$ is coupled to both bistable circuits 10 and 11 by input circuits including a single linear transformer 16 having primary windings 17 connected to respective inputs $_1f_1$ and $_0f_1$ by series, input coupling resistors 18; and secondary windings 19 connected to bistable circuits 10 and 11 by respective resistor-capacitor circuits including resistors 24 and capacitors 25, as shown. It should be noted that this input circuit arrangement of flip-flop F1 provides for direct switching of tunnel diodes 12, of bistable circuits 10 and 11, into opposite high- and low-current stable states, respectively, by any single trigger signal applied to either of the inputs $_1f_1$ or $_0f_1$. A more detailed discussion of this feature is set forth later in the description of the flip-flop circuit operation.

Figure 4:
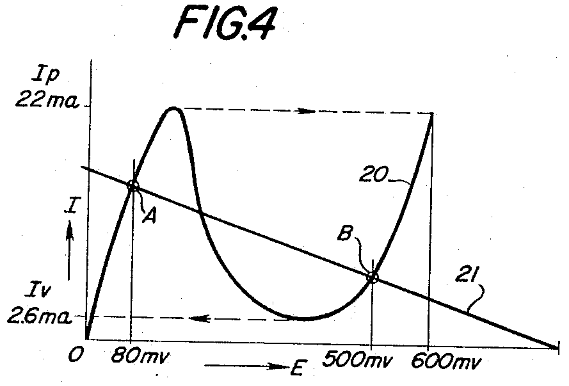
FIG. 4 shows the volt-ampere characteristic curve of a typical tunnel diode used in the bistable circuits of the flip-flop circuit of the present invention.

Referring now more particularly to circuit arrangement of each of the identical bistable tunnel diode circuits 10 and 11 of the flip-flop F1, it should be clear that the operation of these circuits is dependent upon providing high and low stable states of operation in regions of positive resistance at points A and B, for example, as shown on the volt-ampere characteristic curve 20 in FIG. 4. The stable states at points A and B are located at the intersections of conductance load line 21 and the characteristic curve 20. The conductance load line 21 is determined by selecting the value of the resistance 13 to provide operating stability at these high- and low-current points of intersection on the tunnel diode characteristic curve. In the present flip-flop circuit F1, therefore, the stable states of operation comprise the high-current (low-voltage) stable state at point A and the low-current (high-voltage) stable state at point B.

Further, it should be noted that the bistable circuits 10 and 11 provide certain desirable operational features, namely, they are capable of being operated over a relatively narrow voltage range and in the lower voltage region near ground potential, as shown, i.e., FIG. 1 shows tunnel diodes 12 connected directly to ground. Accordingly, germanium tunnel diodes, for example, are admirably suited for use in circuits 10 and 11 and there is no need to employ special tunnel diodes requiring large voltage swings for operation about the region of negative resistance. Also, by the provision of mutual inductive coupling, there is no need for other active elements in the flip-flop circuit for cross coupling of bistable circuits 10 and 11. Thus, in accordance with the flip-flop circuit arrangement of the present invention, the bistable circuits 10 and 11 are shown operated over a narrow voltage range and at or near ground (reference voltage level) while providing for direct response to trigger signals to place these circuits in proper ((opposite) high- and low-current stable states. Accordingly, important features of the present invention are that true and false outputs are provided which are separate and distinct from the trigger inputs, one of the voltage levels for true or false signals is at or near ground (reference level), and low amplitude trigger signals (e.g., —200 mv. as shown in FIG. 2) are adequate to trigger the flip-flop F1 into the proper state.

The function of certain circuit components, alone or in combination, will now be described to provide a basis for the later description of a typical overall operation of the flip-flop F1 in order to provide a better understanding of the invention. As shown in FIG. 1, each of the bistable circuits 10 and 11 is connected to both inputs ${}_1f_1$ and ${}_0f_1$ by the transformer 16. The primary winding 17, connected to input ${}_1f_1$, is wound in one direction, and the winding 17, connected to input ${}_0f_1$, is wound in the opposite direction, as indicated by the polarity dots adjacent opposite ends of these windings. Similarly, the secondary windings 19 are wound in opposite directions. Accordingly, by mutual inductive coupling of both of the secondary windings 19 to each of the primary windings 17, any single trigger signal applied to either input ${}_1f_1$ or input ${}_0f_1$ produces switching signals of opposite phase (e.g., switching signals 22 and 23) on the secondary windings 19 and these switching signals of opposite phase are coupled to bistable circuits 10 and 11 at junctions 26 and 27, respectively, by the resistor-capacitor circuits, as shown. During the time interval these switching signals are present in the input circuits, the positive-going switching signal (e.g., signal 22 shown in FIG. 1) will add to and increase the current flowing in the respective bistable circuit (e.g., circuit 10) beyond the peak current $I_p$ (FIG. 4) of tunnel diode 12 to cause this tunnel diode to be switched to the low-current (high-voltage) state at point B (FIG. 4). At the same time, the negative-going switching signal (e.g., signal 23) applied to the other bistable circuit (e.g., circuit 11) will divert current from the respective tunnel diode 12 and into the secondary winding 19, thereby decreasing the current in this tunnel diode below the valley current $I_v$ (FIG. 4) and causing this tunnel diode to be switched to the high-current (low-voltage) state at point A (FIG. 4). Further, the changes in current produced during switching of tunnel diodes 12 in each of the bistable circuits 10 and 11 produces regenerative feedback currents in the secondary windings 19; and these feedback currents aid the concurrent switching of tunnel diodes 12 to increase the speed of response of flip-flop F1 to the triggering signal (e.g., at input ${}_0f_1$) which initiated the change in state of flip-flop F1. In addition, the inductors 14 provide a high impedance to changes in current in order to supply a constant current to the bistable circuits 10 and 11 whereby the switching signals are capable of being effective to change (increase and decrease) the current through diodes 12 for concurrent switching of these diodes 12 from one stable current state to the other stable current state.

Figure 2:
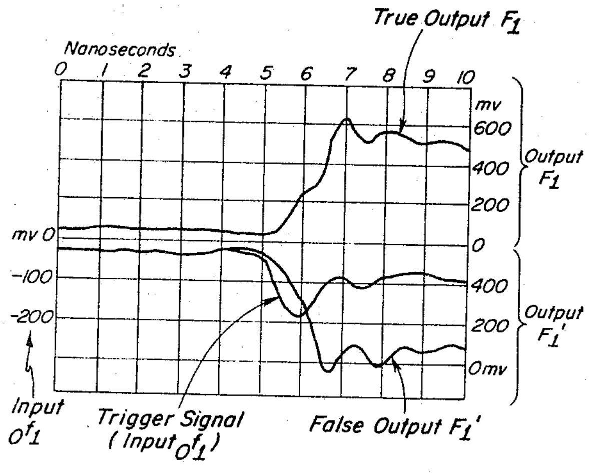
FIGS. 2 and 3 show typical waveforms of true and false output signals and a trigger signal produced during the operation of the present invention.
Figure 3:
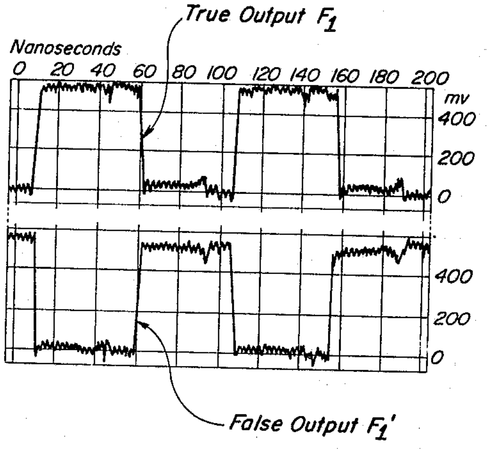

In a typical operation as illustrated by signal waveforms in FIGS. 1 and 2, the tunnel diode flip-flop F2 is responsive to a negative-going trigger signal at the false input ${}_0f_1$ to produce a change in state thereof as evidenced by the change to a high-voltage signal level at the true output $F_1$ and the change to a low-voltage signal level at the false output $F_1'$. For the purpose of explanation, initially it is assumed that flip-flop F1 is in a true state, wherein output $F_1$ is at a low-voltage level (approximately 80 mv.) and output $F_1'$ is at a high-voltage level (approximately 500 mv). A negative-going trigger signal is then applied to false input ${}_0f_1$ which places flip-flop F1 in the false state, wherein output $F_1$ is changed to the high-voltage level (approximately 500 mv.) and output $F_1'$ is changed to the low-voltage level (approximately 80 mv.). Actual oscilloscope traces of these outputs $F_1$ and $F_1'$ and negative-going trigger signal at input ${}_0f_1$ are shown in FIG. 2 to demonstrate the superior performance of the tunnel diode flip-flop of the present invention. In FIG. 3, the oscilloscope tracings of the waveforms at the outputs $F_1$ and $F_1'$ show four (4) changes in state of the flip-flop F1 over a time period of 200 nanoseconds (not the same time period as FIG. 2) in order to show complete output waveforms over many cycles of operation of the flip-flop F1.

Considering one complete cycle of operation in detail, the negative-going trigger signal at false input ${}_0f_1$ is coupled to the respective primary winding 17 of the transformer 16 through the input-coupling resistor 18 to induce opposite-going switching signals 22 and 23 on secondary windings 19. The positive-going switching signal 22 (inverted trigger signal) is coupled to the circuit junction 26 which increases the current through the respective tunnel diode 12 (bistable circuit 10) beyond its peak current $I_p$ (FIG. 4) to cause this tunnel diode to be switched from the high-current (low-voltage) state at point A (FIG. 4) to the low-current (high-voltage) state at point B. Simultaneously, negative-going switching signal 23 is coupled to circuit junction 27 which decreases the current through the respective tunnel diode 12 (bistable circuit 11) below its valley current $I_v$ (FIG. 4) to cause this tunnel diode to be switched from the low-current (high-voltage) state at point B (FIG. 4) to the high-current (low-voltage) state at point A. This completes the cycle of operation in which the flip-flop F1 is changed from the true state to the false state by a negative triggering signal applied to false input ${}_0f_1$.

In view of the foregoing, it should now be evident that a subsequent negative-going trigger applied to true input ${}_1f_1$ will return the flip-flop F1 to the true state. In response to this later trigger signal at input ${}_1f_1$, a negative-going switching signal is coupled to junction 26 to switch the tunnel diode 12 of bistable circuit 10 back to the high-current (low-voltage) state (point A, FIG. 4); and, simultaneously, a positive-going switching signal is coupled to junction 27 to switch tunnel diode 12 of bistable circuit 11 back to the low-current (high-voltage) state (point B, FIG. 4). Also, if desired, it should be noted that positive trigger signals may be used instead of negative trigger signals. When positive trigger signals are used, switching signals of opposite phase are simultaneously coupled to bistable circuits 10 and 11 to place the flip-flop F1 in the desired state in substantially the same manner as previously described except as follows: a positive trigger signal applied to input ${}_1f_1$ will place the flip-flop F1 in the previously designated false state wherein output $F_1$ is at the high-voltage level; and a positive trigger signal applied to input ${}_0f_1$ will place the flip-flop F1 in the previously designated true state wherein output $F_1$ is at the low-voltage level.

From the prior description, it should now be apparent that the mutual inductive coupling of trigger signals to bistable circuits 10 and 11 of flip-flop F1 by the transformer 16 provides for improved high speed operation and enables both bistable circuits 10 and 11 to be switched concurrently and directly by the application of a single trigger signal to the proper input ${}_1f_1$ or ${}_0f_1$. Further, the foregoing desirable operation is obtained with a flip-flop circuit using only two tunnel diodes 12 (e.g., germanium) that are operated within a 600 mv. range (approximately) and one voltage level is near ground potential. More important, there is no limitation as to the material from which the tunnel diodes are constructed or other requirements which would limit the use or operation of the flip-flop F1 in logical systems. Also, the fact that the flip-flop inputs and outputs are separate is an important advantage in providing circuit isolation at the inputs and outputs of the flip-flop circuit.

In the light of the above teachings, various modifications and variations of the present invention are contemplated and will be apparent to those skilled in the art without departing from the spirit and scope of the invention.

What is claimed is:

1. A flip-flop circuit comprising: bistable circuit means including a pair of separate bistable circuits connected in parallel to a current supply source and providing true and false outputs respectively for said flip-flop circuit, each of said bistable circuits including a negative resistance diode having regions of positive resistance separated by a region of negative resistance in its volt-ampere operating characteristics, and an element having a fixed resistance connected in series with said diode such that the diode has no stable point of operation in the region of negative resistance and has high- and low-voltage stable points of operation in the respective regions of positive resistance; input circuits for said flip-flop for receiving trigger signals to control the states of operation of said diodes, said input circuits including a transformer having a pair of primary windings, and a pair of secondary windings coupled to respective ones of said bistable circuits to produce both a positive-going switching signal and a negative-going switching signal, simultaneously, in response to a trigger signal applied to either one of said primary windings; and said bistable circuits being responsive to said switching signals to cause said negative resistance diodes in respective bistable circuits to switch simultaneously to opposite high and low-voltage states at said stable points of operation to produce high- and low-voltage level signals at said true and false outputs.

2. The flip-flop circuit according to claim 1 in which each of said negative resistance diodes comprises a tunnel diode capable of being operated over a small voltage range to provide said high- and low-voltage signals at the true and false outputs.

3. A tunnel diode flip-flop circuit arrangement comprising: first and second bistable series circuit means connected in parallel to a current supply source, each of said bistable circuit means including a tunnel diode and a resistor connected in series therewith to provide high- and low-voltage stable states of operation therefor; input circuit means including transformer circuit means having true and false inputs for receiving trigger signals and a pair of transformer outputs inductively cross-coupled to both said inputs, said outputs being coupled to respective ones of said bistable circuits for switching said tunnel diodes to opposite high- and low-voltage stable states, said transformer circuit means being responsive to a trigger signal applied to either one of said inputs to produce a positive-going switching signal on a corresponding one of said outputs for switching the tunnel diode of the respective bistable circuit from the low-voltage state to the high-voltage stable state, and, simultaneously, producing a negative-going switching signal on the other output for switching the other tunnel diode from the high-voltage state to the low-voltage state; and true and false outputs connected to respective ones of said bistable circuits for providing high- and low-voltage signals according to the state of said tunnel diodes.

4. The tunnel diode flip-flop according to claim 3 in which the transformer circuit means comprises a linear transformer having a pair of primary windings wound in opposite directions and coupled to respective ones of said true and false inputs, and a pair of secondary windings wound in opposite directions to provide said positive and negative-going switching signals on said transformer outputs which are coupled to respective ones of said bistable circuits by separate series connected resistor-capacitor circuits that also provide regenerative feedback currents through the inductive coupling of said secondary windings during any change in state of said tunnel diodes to reinforce and thereby speed-up the switching operation of the tunnel diodes.

5. A flip-flop circuit arrangement comprising in combination: a pair of bistable circuits providing true and false outputs for said flip-flop circuit, each of said bistable circuits comprising a negative resistance diode having regions of positive resistance separated by a region of negative resistance in its volt-ampere operating characteristic curve and a resistor connected in series with said diode to provide high- and low-current stable states of operation at predetermined points in the regions of positive resistance; input circuit means including separate true and false inputs for receiving trigger signals and providing alternating current coupling only from each of said true and false inputs to each of said diodes for producing concurrent positive and negative-going switching signals respectively at said diodes in response to each of said trigger signals to produce concurrent switching of said diodes to low- and high-current stable states, respectively; and output circuit means for said flip-flop including separate true and false outputs coupled to respective ones of said diodes for providing low- and high-voltage level signals corresponding to said high- and low-current stable states of said diodes, respectively.

6. The flip-flop circuit arrangement according to claim 5 in which said input circuit means comprises a transformer having primary and secondary windings inductively cross-coupling each of said true and false inputs to both of said bistable circuits to provide said positive and negative-going switching signals at respective ones of said bistable circuits in response to each trigger signal.

References Cited by the Examiner

UNITED STATES PATENTS

| | | | |
|---|---|---|---|
| 3,087,123 | 4/1963 | Rubenstein et al. | 307—88.5 X |
| 3,122,649 | 2/1964 | Roop | 307—88.5 |
| 3,193,804 | 7/1965 | Perry et al. | 307—88.5 X |
| 3,253,154 | 5/1966 | Kawmoto et al. | 307—88.5 |

DAVID J. GALVIN, *Primary Examiner.*

ARTHUR GAUSS, *Examiner.*

J. JORDAN, *Assistant Examiner.*